United States Patent [19]

Kawamoto

[11] Patent Number: 5,661,342

[45] Date of Patent: Aug. 26, 1997

[54] SEMICONDUCTOR DEVICE WITH HEAT SINK INCLUDING POSITIONING PINS

[75] Inventor: Atsunobu Kawamoto, Tokyo, Japan

[73] Assignee: Mitsubishi Denki Kabushiki Kaisha, Tokyo, Japan

[21] Appl. No.: 552,770

[22] Filed: Nov. 3, 1995

[30] Foreign Application Priority Data

Nov. 9, 1994 [JP] Japan ................. 6-275228

[51] Int. Cl.⁶ ................. H01L 23/34; H01L 23/12
[52] U.S. Cl. ................. 257/712; 257/719; 257/724; 257/732; 361/710; 361/719
[58] Field of Search ................. 257/667, 719, 257/732, 733, 675, 712, 718, 723, 724; 361/707, 710, 717, 718, 719

[56] References Cited

U.S. PATENT DOCUMENTS

| | | | |
|---|---|---|---|
| 3,626,259 | 12/1971 | Garboushian | 257/732 |
| 4,339,768 | 7/1982 | Keller et al. | 357/667 |
| 4,888,307 | 12/1989 | Spairisano et al. | 257/719 |
| 4,950,427 | 8/1990 | Endo | 257/719 |
| 5,309,027 | 5/1994 | Letterman, Jr. | 257/719 |
| 5,311,060 | 5/1994 | Rostoker et al. | 257/667 |

FOREIGN PATENT DOCUMENTS

| | | | |
|---|---|---|---|
| 2441272 | 7/1980 | France | 257/732 |
| 0056359 | 4/1983 | Japan | 257/732 |

*Primary Examiner*—Tom Thomas
*Assistant Examiner*—David Ostrowski
*Attorney, Agent, or Firm*—Leydig, Voit & Mayer, Ltd.

[57] ABSTRACT

A resin molded type semiconductor device having a structure, by which a semiconductor element can be accurately positioned on the heat sink and simultaneously a scrubbing operation is performed on the semiconductor element. This resin molded type semiconductor device has a heat sink, a semiconductor element fixed to the heat sink with a thermal conductive adhesive agent, an electrode electrically connected to the semiconductor element, a plurality of projections on the heat sink, and a sealing resin sealing the heat sink, the semiconductor element, and the electrode. The plurality of projections are used for positioning the semiconductor element and are loosely in contact with at least two sides of the semiconductor element on the heat sink.

10 Claims, 7 Drawing Sheets

5,661,342

1

SEMICONDUCTOR DEVICE WITH HEAT SINK INCLUDING POSITIONING PINS

BACKGROUND OF THE INVENTION

1. Field of the Invention

This invention relates to a resin or plastic molded (or encapsulated) type semiconductor device.

2. Description of the Related Art

FIG. 11 is a front view of a conventional resin molded type semiconductor device. FIG. 12 is a sectional view of the conventional resin molded type semiconductor device. In this figure, it is also illustrated how a screw for mounting the device is inserted thereinto. As shown in FIG. 11, the conventional resin molded type semiconductor device is provided with an electrode lead 6 serving as a first external electrode. Further, a semiconductor element 3 is fixed onto a rectangular heat sink 1, including a mounting hole 10 by solder 4. Thereby, the semiconductor element 3 and the electrode lead 6 are connected to each other electrically and thermally. Further, the semiconductor element 3 and another electrode lead 7 serving as a second external electrode are connected to each other by a bonding wire 5 acting as a conducting means and are thus connected to each other electrically. The electrode lead 7 is composed of an internal electrode 7a, which is a part to be molded or sealed with resin, and an external electrode 7b which is a part to be exposed to the outside or exterior. The heat sink 1, the semiconductor element 3 and the internal electrode 7a are sealed with a sealing or encapsulating resin 2.

In the case of the resin molded type semiconductor device having such a configuration, the solder 4 is used when the semiconductor element 3 is securely fixed to the heat sink 1. The solder 4 sandwiched between the semiconductor element 3 and the heat sink 1, however, should be of uniform thickness. Therefore, when the semiconductor element 3 is firmly fixed to the heat sink 1 after the solder 4 is applied, it is necessary to perform scrubbing which is an operation of shaking the semiconductor element 3 on the heat sink 1 to make the solder 4 even and enhance the conformability of the solder 4.

Preferably, the semiconductor element 3, which acts as a heat generating element, is accurately positioned at a predetermined distance from the mounting hole 10 in such a manner that the semiconductor element 3 is not crushed on the heat sink 1, to which the element 3 is fixed, by the head of the screw 11 used for mounting the heat sink 1 to an external chassis, with the intention of permitting the generated heat to escape to the exterior. Further, multi-pin (or high-pin-count) semiconductor elements or devices developed in recent years require high-accuracy wire bonding. Moreover, it is desirable for achieving a high-accuracy wire bonding that the semiconductor element 3 be accurately positioned at a predetermined mounting location on the heat sink 1.

As described hereinabove, it is required that the semiconductor element 3 be accurately positioned on the heat sink 1. To that end, there has been devised a method by which a projection for positioning is provided on the heat sink 1 and thus the semiconductor element 3 is accurately fixed to a predetermined position on the heat sink 1 (see the Japanese Utility Model Public Disclosure No. 4-10346/1992 Official Gazette).

FIG. 13 is a front view of an example of the semiconductor device disclosed in the Japanese Utility Model Public Disclosure No. 4-10346/1992 Official Gazette. FIG. 14 is a sectional view of the example of the semiconductor device of FIG. 13. As illustrated in FIG. 13, in the case of this device, continuous frame-like walls 9a, 9b, 9c and 9d are provided in such a way as to surround four sides of the semiconductor element 3. Thereby, the semiconductor element 3 is positioned at a predetermined location and is further fixed thereat.

However, in the case of the aforementioned conventional positioning method, the semiconductor element is completely fixed onto the heat sink 1. It is, therefore, impossible to scrub the semiconductor element 3.

Thus, although the semiconductor element 3 can be accurately positioned at the predetermined mounting location on the heat sink 1, the thickness of the solder 4 between the semiconductor element 3 and the heat sink 1 can not be made to be uniform. Further, because the solder 4 is surrounded by the continuous walls, there is no escape path for the solder 4 when the semiconductor element 3 is pressed or scrubbed.

The present invention is accomplished to solve the aforementioned problems of the conventional device and method.

SUMMARY OF THE INVENTION

Accordingly, an object of the present invention is to provide a resin molded type semiconductor device having a structure, by which a semiconductor element can be accurately positioned and simultaneously scrubbed.

To achieve the foregoing object and in accordance with an aspect of the present invention, there is provided a resin molded type semiconductor device which comprises a heat sink, a semiconductor element fixed to the heat sink with a thermally conductive adhesive agent, an electrode electrically connected to the semiconductor element, a plurality of projections for positioning the semiconductor element, loosely in contact with at least two sides of the semiconductor element on the heat sink, and a sealing resin for sealing the heat sink, the semiconductor element and the electrode.

Thus, in the case of this resin molded type semiconductor device, the position of the semiconductor element is loosely restricted by the inside surfaces of the positioning projections when the semiconductor element is fixed onto the heat sink. Thereby, a scrubbing operation can be performed on the semiconductor element, and moreover, the semiconductor element can be accurately positioned. Moreover, the entire resin molded type semiconductor device can be made compact in size.

Further, in the case of a practical embodiment of this resin molded type semiconductor device, each of the projections has a cylindrical shape.

Thus, in the case of this embodiment, the side surfaces of the semiconductor element are not damaged by the projections when a scrubbing operation is performed on the semiconductor element. Thereby, a function failure of the resin molded type semiconductor device can be prevented from occurring owing to damage to the device.

Moreover, in the case of another practical embodiment of the resin molded type semiconductor device, the plurality of the projections are obtained by removing unnecessary projections according to the size of the semiconductor element, which is fixed onto the heat sink, from a large number of projections preliminarily formed on the heat sink.

Thus, in the case of this embodiment, the heat sink is used after unnecessary projections are removed according to the size of the semiconductor element. Thereby, a kind of one heat sink can be used for the semiconductor devices of a plurality of different sizes.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, the preferred embodiments of the present invention will be described in detail by referring to the accompanying drawings.

Embodiment 1

Figure 1:
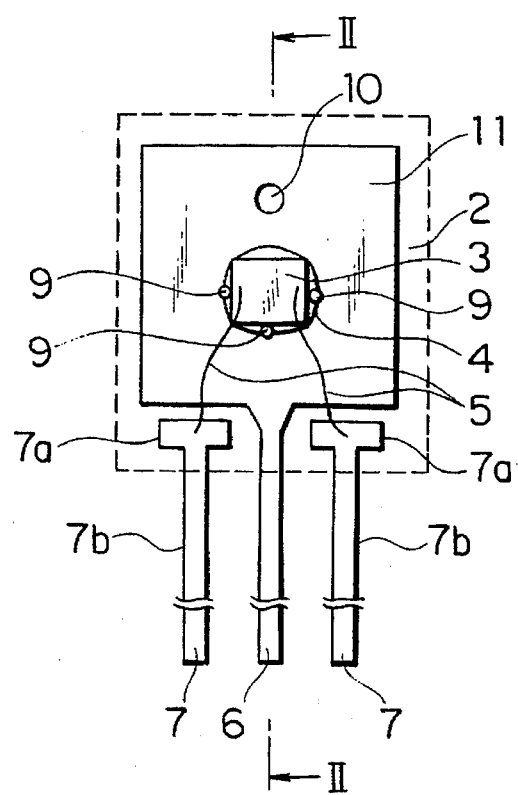
FIG. 1 is a front view of a first resin molded type semiconductor device embodying the present invention, Embodiment 1 of the present invention.
Figure 2:
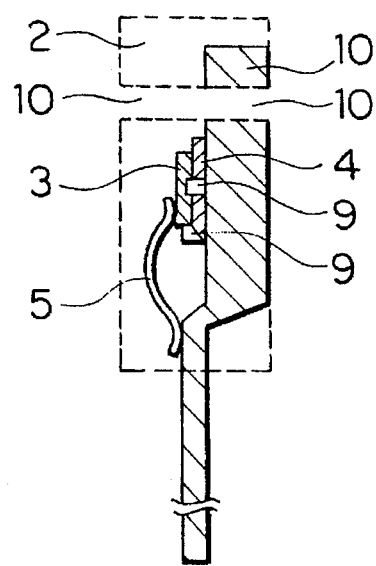
FIG. 2 is a sectional view of this resin molded type semiconductor device embodying the present invention.

FIG. 1 is a front view of a first resin molded or encapsulated type semiconductor device embodying the present invention, namely, Embodiment 1 of the present invention. Further, FIG. 2 is a sectional view of this resin molded type semiconductor device embodying the present invention, which is taken on line 2—2 of FIG. 1. In these figures, reference numerals 2 to 7 designate like parts of the conventional device. Thus, the descriptions of such parts are omitted. Cylindrical projections 9 for positioning the semiconductor element 3 are provided at three places on a heat sink 11. Further, the projections 9 are placed in such a manner that a scrubbing operation can be performed on the semiconductor element 3 only in a direction parallel to the heat sink 11. Namely, the projections 9 are provided at places where these projections can be loosely in contact with left, right and bottom sides of the semiconductor element 3, respectively, as viewed in FIG. 1. Thus the projections 9 restrain the semiconductor element 3 from moving further laterally and downwardly, while the projections 9 permit the semiconductor element 3 to make a scrubbing motion in the upward and downward directions as viewed in FIG. 1. Further, the projections 9 are placed in such a way as to touch the semiconductor element 3 after the scrubbing is finished, to thereby position the element 3 in the predetermined position. Moreover, because means for positioning are the spaced projections 9, the solder 4 having been pushed out of the space between the semiconductor element 3 and the heat sink 11 can easily flow from the space between the projections 9 to the exterior. Consequently, the operation of scrubbing is not obstructed at all.

As the result of providing such positioning projections 9 in the device, the position of the semiconductor element 3 is restricted and the positioning of the semiconductor element 3 can be achieved accurately. Moreover, the operation of scrubbing the semiconductor element 3 in the upward and downward directions as viewed in FIG. 1 can be realized. Furthermore, each of the projections 9 has a cylindrical shape, so that the side surfaces of the semiconductor element 3 are not damaged even if the semiconductor element 3 is shaken within the space surrounded by the projections 9. Additionally, the projections 9 are formed by providing a concave portion in a die when the heat sink 11 is molded by using the die.

Directions in which the semiconductor element 3 is scrubbed are limited to upward and downward directions as viewed in FIG. 1. Therefore, although all of the left, right, top and bottom margins of the heat sink 11 should be estimated or set in order to perform a scrubbing operation on the semiconductor element in the leftward and rightward directions and in the upward and downward directions, as viewed in FIG. 1, in the case of the conventional device, it is unnecessary for this embodiment of the present invention to set the left and right margins of the heat sink 11. Thereby, the entire device can be made compact in size.

Figure 3:
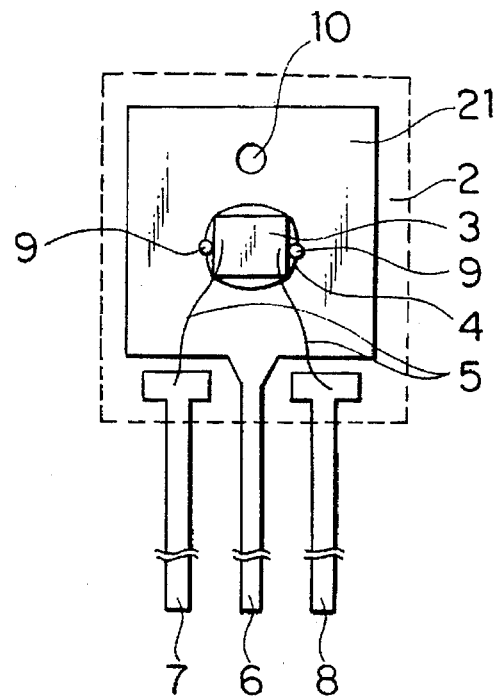
FIG. 3 is a diagram illustrating how two projections are provided in a lateral direction in a modification of Embodiment 1 of the present invention.
Figure 4:
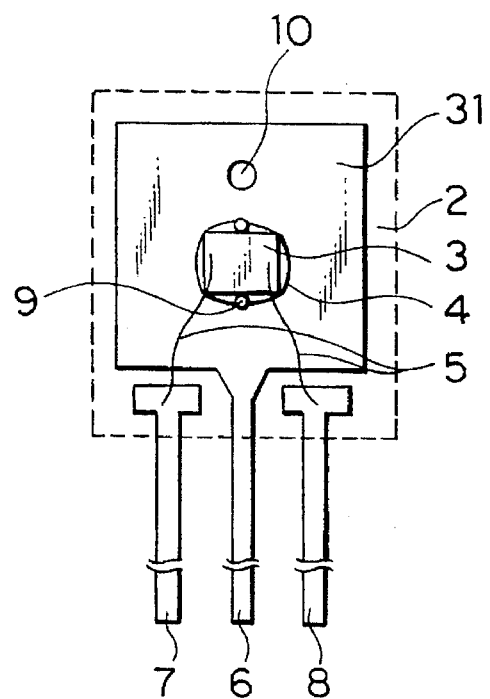
FIG. 4 is a diagram illustrating how two projections are provided in a longitudinal direction in still another modification of Embodiment 1 of the present invention.
Figure 5:
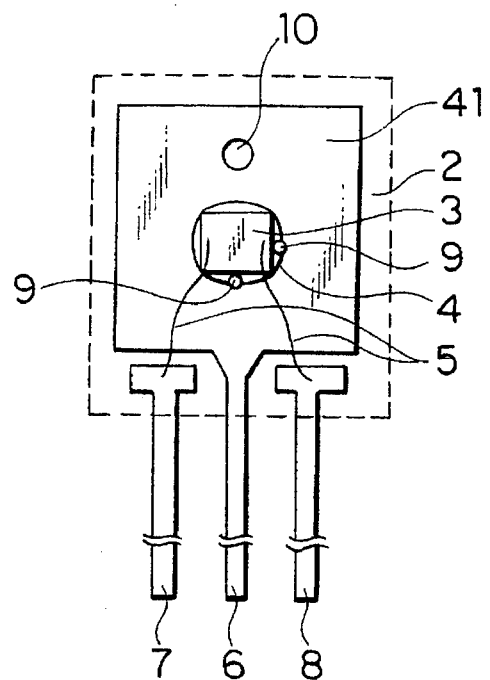
FIG. 5 is a diagram illustrating how two projections are provided in such a manner as to be in contact with two adjoining sides of a semiconductor element of yet another modification of Embodiment 1 of the present invention, respectively.

In the case of this embodiment, three projections are provided in the device. Alternatively, two projections may be provided on the left and right sides of the semiconductor element 3 as illustrated in FIG. 3. Thereby, the semiconductor element 3 can be positioned only in the lateral direction as illustrated in this figure. Alternatively, two projections may be provided on the top and bottom sides of the semiconductor element 3 as illustrated in FIG. 4. Thereby, the semiconductor element 3 can be positioned only in the upward and downward directions as illustrated in this figure. Additionally, the semiconductor element 3 can be positioned by providing only two projections 9 on a heat sink 41 in such a way as to be in contact with two adjacent sides of the semiconductor element 3, respectively, by pressing the semiconductor element 3 against the projections 9.

This embodiment and the modifications thereof can obtain excellent effects or advantages in that the scrubbing of the semiconductor can be performed while the semiconductor element 3 is positioned accurately. Moreover, this embodiment and the modifications thereof can be realized by using only two projections. Consequently, the manufacturing cost of the heat sink can be reduced.

Figure 6:
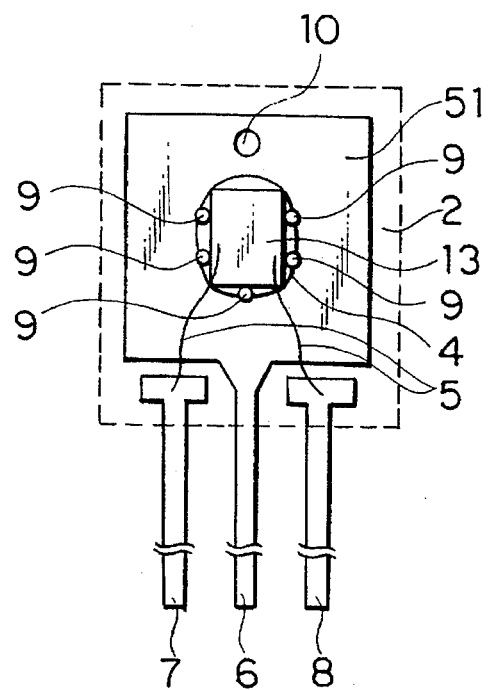
FIG. 6 is a diagram illustrating how two projections are provided along each of the long sides of a rectangular semiconductor element of yet another modification of Embodiment 1 of the present invention.

Further, as illustrated in FIG. 6, a semiconductor element 13 can be positioned by using a total of five projections 9, namely, by providing one projection on one of the short sides of the rectangular semiconductor element 13 and further providing two projections on each of the long sides thereof. With such a configuration, the semiconductor element 13 can hardly rotate on a heat sink 51. Thus, even in the case where the semiconductor element 13 has a rectangular shape, the positioning of the semiconductor element 13 can be stably performed.

Embodiment 2

Figure 7:
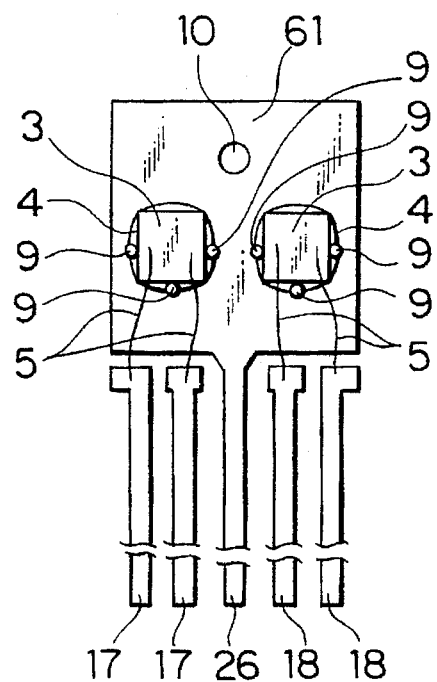
FIG. 7 is a front view of a second resin molded type semiconductor device embodying the present invention, namely, Embodiment 2 of the present invention, on which a plurality of semiconductor elements are mounted.

FIG. 7 illustrates another embodiment of the present invention, namely, Embodiment 2 in which a plurality of semiconductor elements 3 are securely fixed to a heat sink 61. Usually, in the case where the plurality of semiconductor elements 3 are fixed onto the heat sink 1 using solder 4, the heat sink 1 for performing scrubbing operations on the plurality of semiconductor elements 3, which has an large area is needed. The directions, in which the scrubbing operation is performed on the semiconductor element 3 are restricted to upward and downward directions as viewed in this figure, because of the provision of the projections for positioning. Thereby, the lateral size of the heat sink 61 can be decreased.

Figure 8:
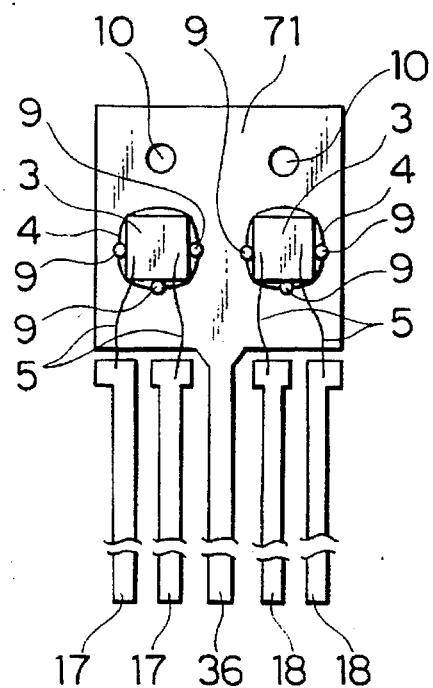
FIG. 8 is a front view of a modification of the second resin molded type semiconductor device, on which a plurality of semiconductor elements are mounted, and in which a plurality of mounting holes are present.
Figure 9:
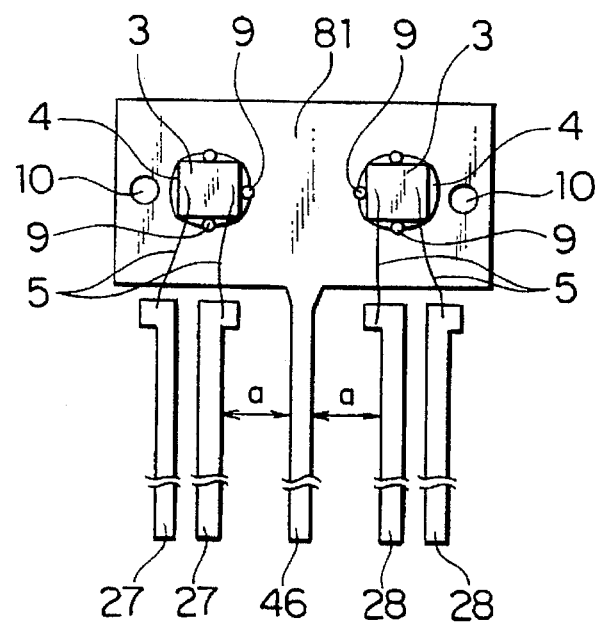
FIG. 9 is a front view of another modification of the second resin molded type semiconductor device, on which a plurality of semiconductor elements are mounted, and of which the longitudinal side is shorter than the lateral side (namely, the vertical side is shorter than the horizontal side as viewed in this figure)

Further, an area required to perform the scrubbing is small, so that a plurality of mounting holes 10 can be included in the heat sink as illustrated in FIG. 8. Moreover, in the case where the resin molded type semiconductor device has the longitudinal sides, each of which is shorter than each of the lateral sides thereof, as illustrated in FIG. 9, the mounting holes 10 are provided on both sides of the semiconductor element 3, respectively. In the case of this embodiment, the directions in which a scrubbing operation is performed on the semiconductor element 3 are limited to the lateral directions. Consequently, the length of the device (namely, the vertical size thereof as viewed in this figure) can be shortened.

Embodiment 3

Figure 10:
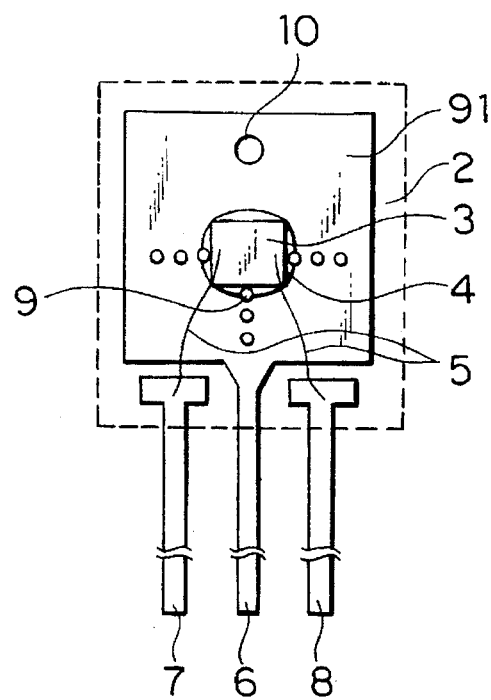
FIG. 10 is a diagram illustrating how many projections respectively corresponding to semiconductor elements of a plurality of sizes are provided in a third resin molded type semiconductor device, namely, Embodiment 3 of the present invention.
Figure 11:
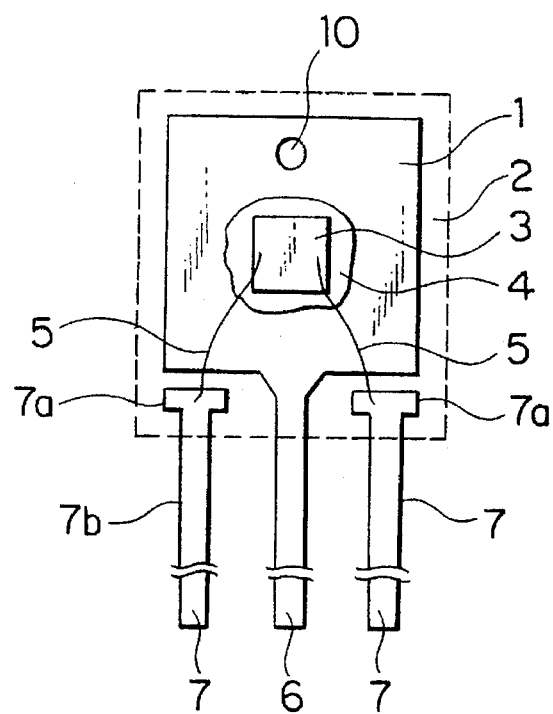
FIG. 11 is a front view of a conventional resin molded type semiconductor device.
Figure 12:
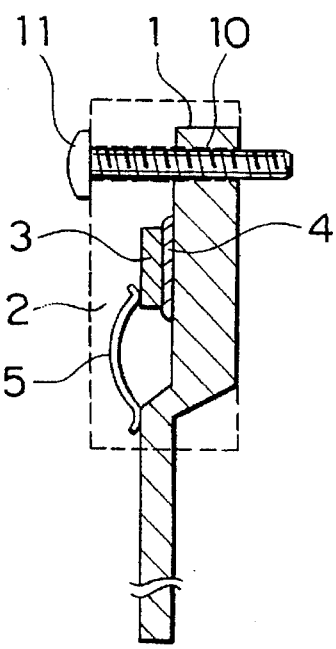
FIG. 12 is a sectional view of the conventional resin molded type semiconductor device of FIG. 11.
Figure 13:
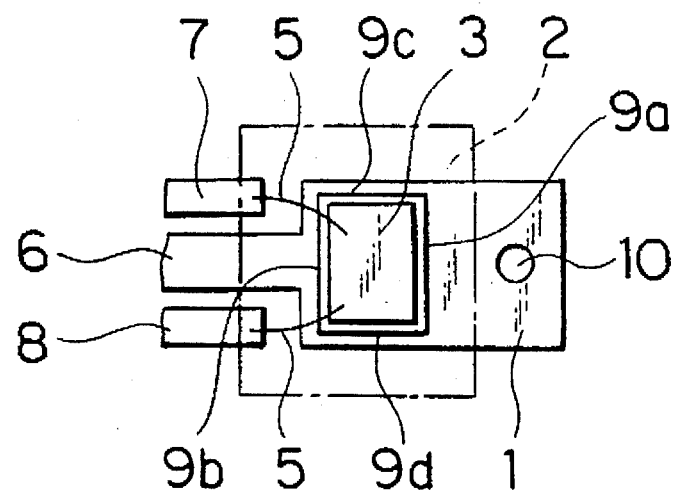
FIG. 13 is a front view of another conventional resin molded type semiconductor device.
Figure 14:
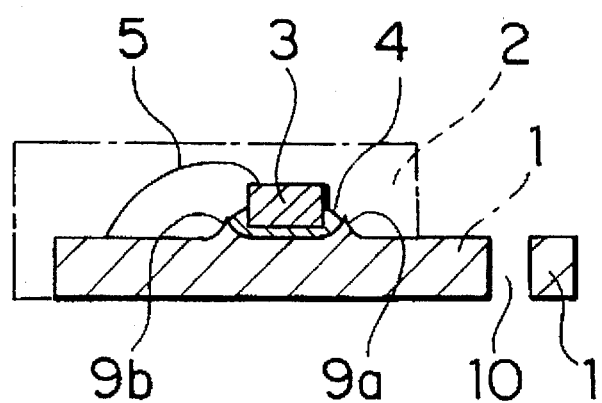
FIG. 14 is a sectional view of the conventional resin molded type semiconductor device of FIG. 13.

FIG. 10 is a front view of still another resin molded type semiconductor device, namely, Embodiment 3 of the present invention. As shown in this figure, a group of three projections 19 is provided in such a manner as to be aligned perpendicularly to each of the sides of the semiconductor element 3, which are used for the positioning thereof. The three projections 19 provided on each side correspond to three sizes of the semiconductor element 3, namely, large, medium and small sizes thereof. In the case where the semiconductor element 3 of the large or medium size is fixedly mounted onto the heat sink 91, the device is used by eliminating one or more of the unnecessary inner projections 9 by using a file or the like.

With such a configuration, only one kind of a heat sink can be used for a semiconductor element 3 of three sizes. Apparently, only one kind of a heat sink can be used for the semiconductor element 3 by providing a further large number of projections on the heat sink.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A semiconductor device comprising:

a heat sink;

a first semiconductor element bonded to the heat sink with a thermally conductive adhesive agent;

an electrode electrically connected to the semiconductor element;

a plurality of pins projecting from the heat sink for positioning the first semiconductor element, the pins being disposed adjacent at least two sides of the first semiconductor element on the heat sink for allowing flow of the thermally conductive adhesive agent during bonding of the first semiconductor element to the heat Sink with the thermally conductive adhesive agent.

2. The semiconductor device according to claim 1 wherein each of the pins is cylindrical.

3. The semiconductor device according to claim 1 wherein the plurality of pins comprises at least two removable pins on the heat sink at a side of the semiconductor element, the pins being arranged in a row transverse to the side of the semiconductor element.

4. The semiconductor device of claim 3 including a respective pair of pins adjacent each of first and second opposite sides of the first semiconductor element.

5. The molded semiconductor device of claim 4 including a single pin adjacent a third side of the first semiconductor element.

6. The semiconductor device of claim 3 comprising at least two rows of pins, each row including at least two pins and being disposed at a respective side of the first semiconductor element, the rows being transverse to the respective sides of the first semiconductor element.

7. The semiconductor device of claim 1 wherein the plurality of pins consists of two pins adjacent respective opposite sides of the first semiconductor element.

8. The semiconductor device of claim 1 wherein the plurality of pins consists of two pins adjacent respective adjacent sides of the first semiconductor element.

9. The semiconductor device of claim 1 including a respective pin adjacent each of three sides of the first semiconductor element.

10. The semiconductor device of claim 1 comprising a second electrode and a second semiconductor element wherein the plurality of pins includes two pairs of projecting pins, one pair of projecting pins being positioned adjacent respective sides of the first semiconductor element and another pair of positioning pins being positioned adjacent respective sides of the second semiconductor element, the second semiconductor element is bonded to the heat sink with the thermally conductive adhesive agent, and the second semiconductor element is electrically connected to the second electrode.

* * * * *